(12) United States Patent
Tseng et al.

(10) Patent No.: US 10,936,091 B1
(45) Date of Patent: Mar. 2, 2021

(54) PRESSING STRUCTURE OF MOUSE

(71) Applicant: Cheng Uei Precision Industry Co., LTD., New Taipei (TW)

(72) Inventors: Chi-Ming Tseng, New Taipei (TW); Ming-Han Kuo, New Taipei (TW); Chang-Ting Ho, New Taipei (TW)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 17/033,517

(22) Filed: Sep. 25, 2020

(30) Foreign Application Priority Data

Dec. 3, 2019 (CN) .......................... 201922138855.1

(51) Int. Cl.
*G06F 3/0354* (2013.01)
*G06F 3/038* (2013.01)

(52) U.S. Cl.
CPC .......... *G06F 3/03543* (2013.01); *G06F 3/038* (2013.01)

(58) Field of Classification Search
CPC .............................. G06F 3/03543; G06F 3/038
See application file for complete search history.

(56) References Cited

U.S. PATENT DOCUMENTS

| | | | |
|---|---|---|---|
| 8,354,999 B2 * | 1/2013 | Zhang | H01H 3/60 345/163 |
| 9,721,711 B2 * | 8/2017 | Liu | H01F 7/0252 |
| 10,216,291 B1 * | 2/2019 | Lu | G06F 3/033 |
| 10,592,009 B2 * | 3/2020 | Rizvi | G06F 3/03543 |

* cited by examiner

*Primary Examiner* — Bryan Earles
(74) *Attorney, Agent, or Firm* — Cheng-Ju Chiang (57) ABSTRACT

A pressing structure of a mouse includes a base, a circuit board mounted on the base, at least one electronic switch mounted on the circuit board, an upper cover mounted on the base, and a button shell. A rear end wall of the at least one opening protrudes downward and extends towards a front end wall of the at least one opening to form a buckling block. A bottom of the buckling block is recessed inward to form a first accommodating groove equipped with a first magnet. The button shell has at least one button. The at least one button protrudes downward to form at least one contact portion. A rear surface of the at least one contact portion is recessed inward to form a buckling space corresponding to the buckling block. The at least one contact portion is equipped with a second magnet.

17 Claims, 8 Drawing Sheets

PRESSING STRUCTURE OF MOUSE

CROSS-REFERENCE TO RELATED APPLICATION

The present application is based on, and claims priority from, China Patent Application No. 201922138855.1, filed Dec. 3, 2019, the disclosure of which is hereby incorporated by reference herein in its entirety.

BACKGROUND OF THE INVENTION

1. Field of the Invention

The present invention generally relates to a pressing structure of a mouse, and more particularly to a pressing structure of a mouse which is capable of maintaining a better hand feeling of a user pressing on the mouse.

2. The Related Art

Figure 7:
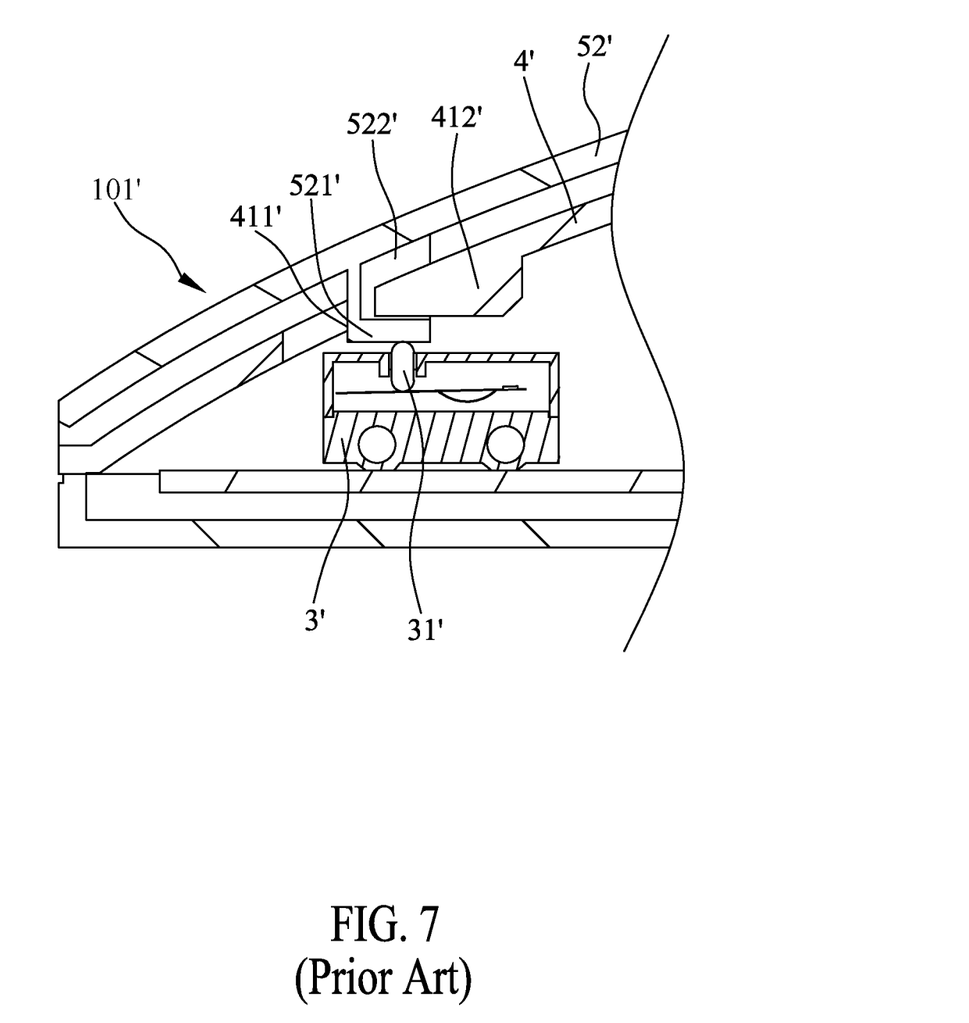
FIG. 7 is a sectional view of a conventional mouse in prior art, wherein a pressing structure of the conventional mouse is shown.
Figure 8:
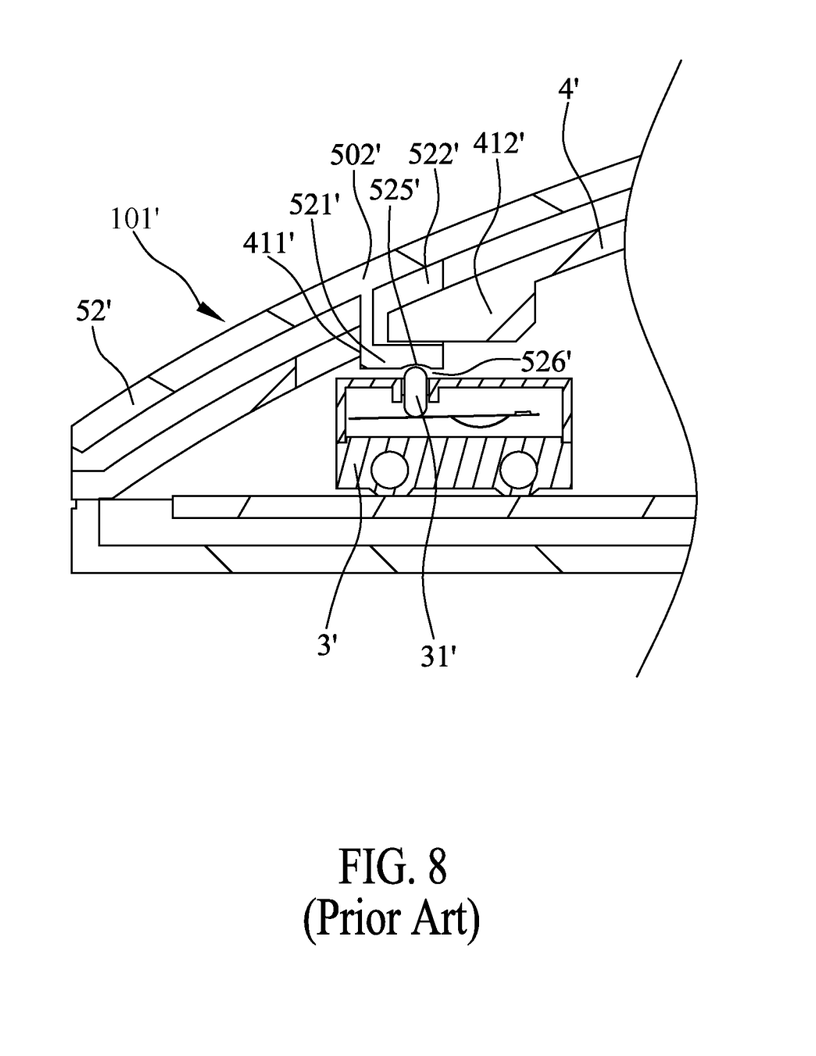
FIG. 8 is another sectional view of the conventional mouse of FIG. 7, wherein the pressing structure of the conventional mouse is shown.

With reference to FIG. 7 and FIG. 8, a conventional pressing structure 101' of a mouse includes at least one electronic switch 3', an upper cover 4', and at least one button 52' covered to an outside of the upper cover 4'. The electronic switch 3' has a stirring portion 31' projecting beyond a top surface of the electronic switch 3'. The upper cover 4' has at least one opening 411', and the opening 411' is corresponding to the stirring portion 31' of the electronic switch 3'. One end wall of the opening 411' protrudes towards the other end wall of the opening 411' and protrudes downward to form a buckling block 412' projecting into the opening 411'. The button 52' has a main portion 502'. A bottom surface of the main portion 502' protrudes downward and then extends rearward to form an L-shaped contact portion 521', and the contact portion 521' passes downward through the opening 411' and contacts the stirring portion 31' of the electronic switch 3'. The contact portion 521' defines a buckling space 522' penetrating through a rear of the contact portion 521', and the buckling block 412' is mounted in the buckling space 522'. The user pushes downward the at least one button 52' to push the contact portion 521' to press the stirring portion 31' downward, so that a button function of the conventional pressing structure 101' of the mouse is started.

With reference to FIG. 8, when the user presses on the conventional pressing structure 101' of the mouse for a period of time, a contacting position between the contact portion 521' and the stirring portion 31' will generate an abrasion 525', and a gap 526' is formed between the contact portion 521' and the stirring portion 31'. Thereby a hand feeling of a user pressing on the conventional pressing structure 101' of the mouse is affected.

Therefore, it is necessary to provide an innovative pressing structure of a mouse which is capable of maintaining a better hand feeling of a user pressing on the innovative pressing structure of the mouse.

SUMMARY OF THE INVENTION

An object of the present invention is to provide a pressing structure of a mouse. The pressing structure of the mouse includes a base, a circuit board mounted on the base, at least one electronic switch mounted on the circuit board, an upper cover and a button shell. The at least one electronic switch has a pressing portion, and the pressing portion is exposed upward from a top of the at least one electronic switch. The upper cover is mounted on the base, and covers the circuit board and the at least one electronic switch. An upper surface of the upper cover is recessed downward to form a fixing groove. At least one portion of a bottom wall of the fixing groove has at least one opening penetrating through the bottom wall of the fixing groove and communicated with the fixing groove, and the at least one opening is corresponding to the at least one electronic switch. A rear end wall of the at least one opening protrudes downward and extends towards a front end wall of the at least one opening to form a buckling block projecting into the at least one opening and spaced from the front end wall of the at least one opening. A bottom of the buckling block is recessed inward and opposite to the pressing portion of the at least one electronic switch to form a first accommodating groove. The first accommodating groove is corresponding to and located above the pressing portion of the at least one electronic switch. The first accommodating groove is equipped with a first magnet. The button shell has a fixing portion, at least one button, and at least one elastic arm connected between the fixing portion and the at least one button. The fixing portion, the at least one button and the at least one elastic arm are fixed in the fixing groove. A bottom surface of the at least one button protrudes downward to form at least one contact portion. The at least one contact portion passes through the at least one opening and contacts the pressing portion of the at least one electronic switch. A rear surface of the at least one contact portion is recessed inward to form a buckling space, and the buckling space is corresponding to the buckling block. The buckling block is buckled in the buckling space. An inside of the buckling space of the at least one contact portion is equipped with a second magnet. The second magnet is corresponding to and located below the first magnet. Polarities of two facing surfaces of the first magnet and the second magnet are the same, so a repulsive force is generated between the first magnet and the second magnet.

Another object of the present invention is to provide a pressing structure of a mouse. The pressing structure of the mouse includes a circuit board, at least one electronic switch, a case and a button shell. The at least one electronic switch is mounted on the circuit board. The at least one electronic switch has a pressing portion, and the pressing portion is exposed upward from a top of the at least one electronic switch. The case receives the circuit board and the at least one electronic switch. The case has at least one opening penetrating through an upper surface and a lower surface of the case, and the at least one opening is corresponding to the at least one electronic switch. A first end wall of the at least one opening protrudes downward and extends towards a second end wall of the at least one opening opposite to the first end wall of the at least one opening to form a buckling block projecting into the at least one opening and spaced from the second end wall of the at least one opening. The buckling block is equipped with a first magnet, and the first magnet is corresponding to and located above the pressing portion of the at least one electronic switch. The button shell is mounted on the case. The button shell has at least one button. The at least one button protrudes downward to form at least one contact portion. The at least one contact portion passes through the at least one opening and contacts the pressing portion of the at least one electronic switch. A surface of the at least one contact portion is recessed inward to form a buckling space, and the buckling space is corresponding to the buckling block. The buckling block is buckled in the buckling space. A bottom surface of the at least one contact portion is equipped with a second magnet. The second magnet is disposed above and corresponding to the pressing portion of the at least one electronic switch. The second magnet is made of metal. The second magnet is corresponding to and disposed below the first magnet. Polarities of two adjacent corresponding surfaces of the first magnet and the second magnet are the same, so a repulsive force is generated between the first magnet and the second magnet.

Another object of the present invention is to provide a pressing structure of a mouse. The pressing structure of the mouse includes a base, a circuit board mounted on the base, at least one electronic switch, an upper cover and a button shell. The at least one electronic switch is mounted on the circuit board. The at least one electronic switch has a pressing portion, and the pressing portion is exposed upward from a top of the at least one electronic switch. A material of the pressing portion of the at least one electronic switch is a metal. The upper cover is mounted on the base, and covers the circuit board and the at least one electronic switch. An upper surface of the upper cover is recessed downward to form a fixing groove. At least one portion of a bottom wall of the fixing groove has at least one opening penetrating through the bottom wall of the fixing groove and communicated with the fixing groove, and the at least one opening is corresponding to the at least one electronic switch. A rear end wall of the at least one opening protrudes downward and extends towards a front end wall of the at least one opening to form a buckling block projecting into the at least one opening and spaced from the front end wall of the at least one opening. The button shell has a fixing portion, at least one button, and at least one elastic arm connected between the fixing portion and the at least one button. The fixing portion, the at least one button and the at least one elastic arm are fixed in the fixing groove. A bottom surface of the at least one button protrudes downward to form at least one contact portion. The at least one contact portion passes through the at least one opening and contacts the pressing portion of the at least one electronic switch. A rear surface of the at least one contact portion is recessed inward to form a buckling space, and the buckling space is corresponding to the buckling block. The buckling block is buckled in the buckling space. A bottom surface of the at least one contact portion is equipped with a second magnet. The second magnet is disposed above and corresponding to the pressing portion of the at least one electronic switch. A material of the second magnet is the metal. A magnetic attraction force is generated between the second magnet and the pressing portion of the at least one electronic switch to keep the at least one contact portion together with the second magnet contacting the pressing portion of the at least one electronic switch.

As described above, after a user uses the at least one contact portion of the mouse for a long period of time, the at least one contact portion of the pressing structure of the mouse is without being abraded, and the at least one contact portion keeps contacting with the pressing portion of the at least one electronic switch, so the pressing structure of the mouse maintains a better hand feeling of the user pressing on the at least one button of the pressing structure of the mouse. As a result, an idle stroke problem of the mouse is prevented from being caused.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
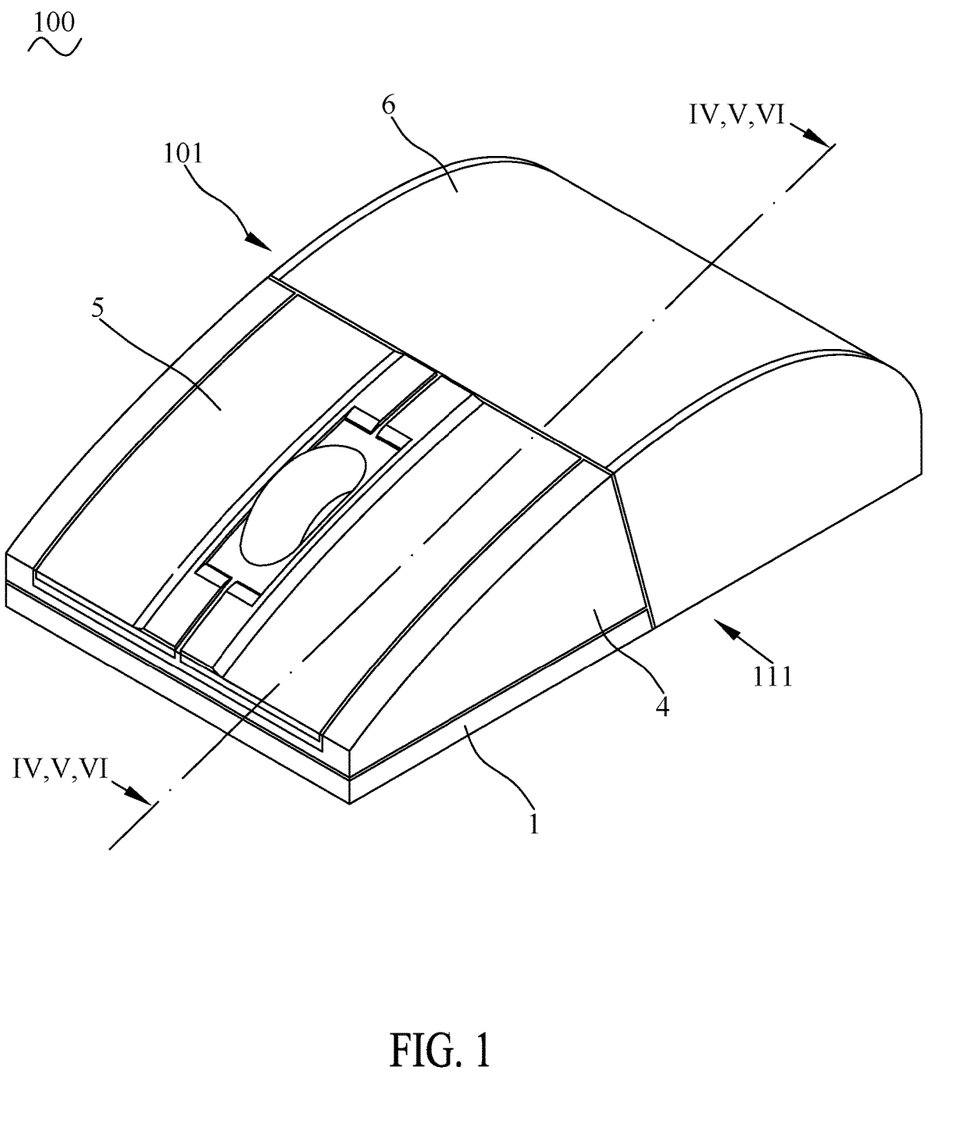
FIG. 1 is a perspective view of a pressing structure of a mouse in accordance with the present invention, wherein different upper covers and button shells of the pressing structures of the mouses in accordance with a first preferred embodiment, a second preferred embodiment and a third preferred embodiment of the present invention are shown in different conditions.
Figure 2:
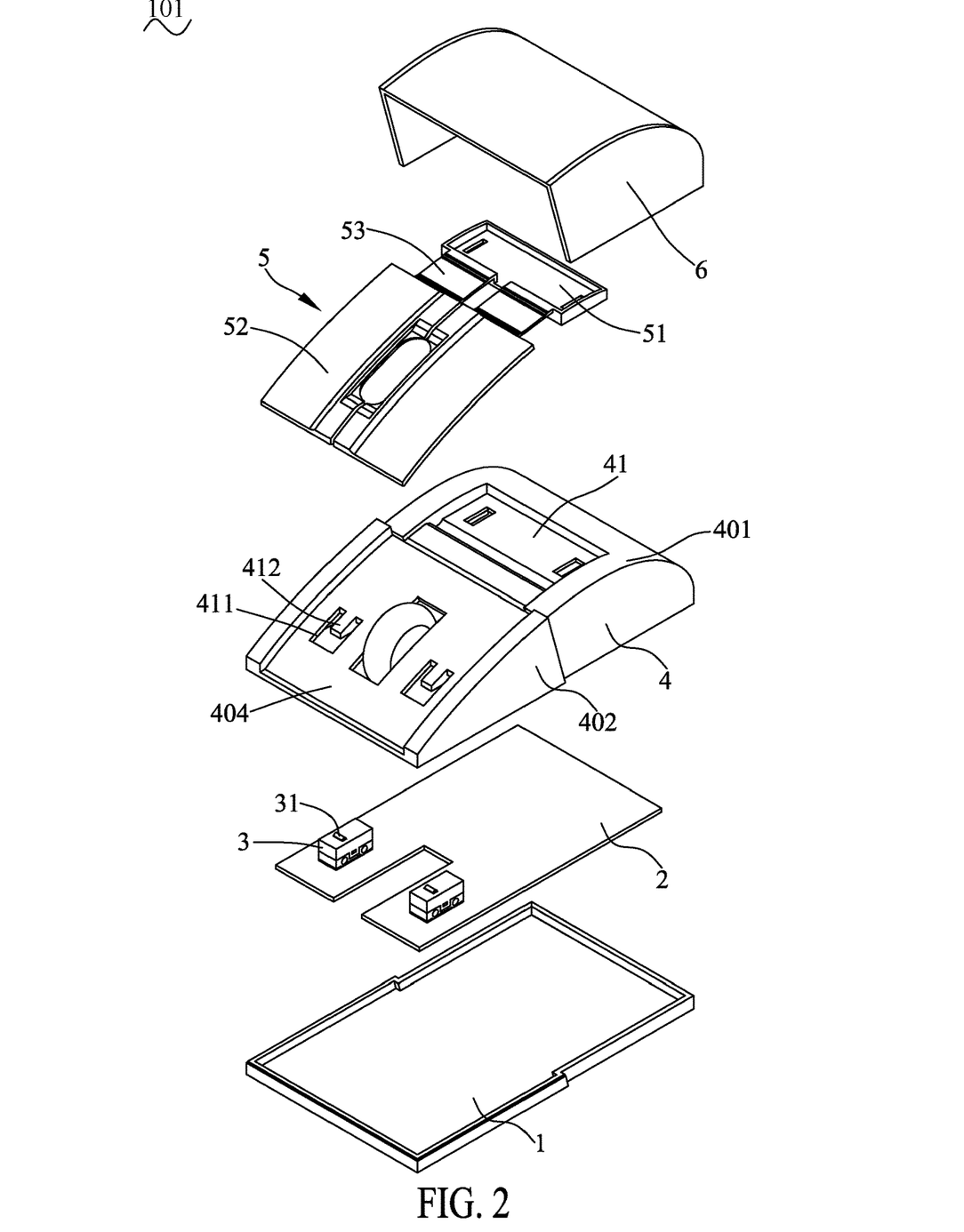
FIG. 2 is an exploded perspective view of the pressing structure of the mouse of FIG. 1.
Figure 3:
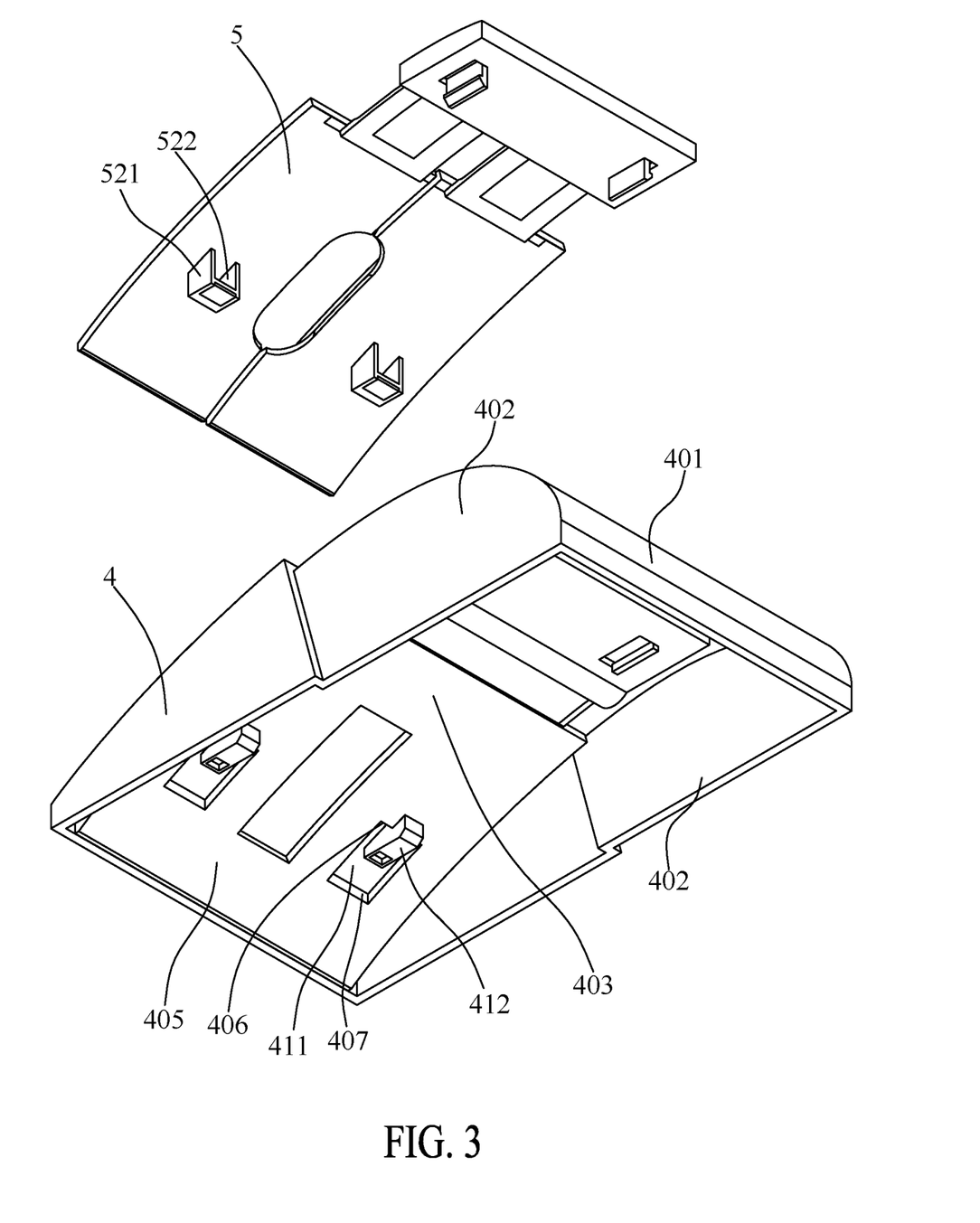
FIG. 3 is a partially exploded perspective view of the pressing structure of the mouse of FIG. 2.

With reference to FIG. 1 to FIG. 3, a mouse 100 and a pressing structure 101 of the mouse 100 are shown in the present invention. The mouse 100 includes the pressing structure 101, and the pressing structure 101 of the mouse 100 includes a base 1, a circuit board 2, at least one electronic switch 3, an upper cover 4, a button shell 5 and a rear cover 6. The mouse 100 further includes the base 1, the circuit board 2, the at least one electronic switch 3, the upper cover 4, the button shell 5 and the rear cover 6. The pressing structure 101 of the mouse 100 further includes a case 111. The base 1, the upper cover 4 and the rear cover 6 are assembled into the case 111.

The case 111 receives the circuit board 2 and the at least one electronic switch 3. The case 111 is shown as an arc shape. The case 111 has at least one opening 411 penetrating through an upper surface 404 and a lower surface 405 of the case 111, and the at least one opening 411 is corresponding to the at least one electronic switch 3. The at least one opening 411 extends along the arc-shaped case 111. The at least one electronic switch 3 has a pressing portion 31 protruded upward, and the pressing portion 31 is exposed upward from a top of the at least one electronic switch 3. A first end wall 406 of the at least one opening 411 protrudes downward and extends towards a second end wall 407 of the at least one opening 411 opposite to the first end wall 406 of the at least one opening 411 to form a buckling block 412 projecting into the at least one opening 411 and spaced from the second end wall 407 of the at least one opening 411. The buckling block 412 is equipped with a first magnet 7, and the first magnet 7 is corresponding to and located above the pressing portion 31 of the at least one electronic switch 3. The at least one electronic switch 3 is mounted on the circuit board 2. The circuit board 2 is mounted on the base 1.

The upper cover 4 is of a hollow shape. The upper cover 4 has a top wall 401 arched upward, and two lateral walls 402 extended downward from two opposite sides of the top wall 401. The upper cover 4 has a receiving space 403 penetrating through a bottom of the upper cover 4, and the receiving space 403 is surrounded among the top wall 401 and the two lateral walls 402. The case 111 includes the base 1, the upper cover 4 and the rear cover 6. The upper cover 4 is mounted on the base 1, and covers the circuit board 2 and the at least one electronic switch 3. A middle of an upper surface of the upper cover 4 is recessed downward to form a fixing groove 41. At least one portion of a bottom wall of the fixing groove 41 has the at least one opening 411 penetrating through the bottom wall of the fixing groove 41 and communicated with the fixing groove 41, and the at least one opening 411 is corresponding to the at least one electronic switch 3. The at least one opening 411 penetrates through the top wall 401 of the upper cover 4. Preferably, the pressing structure 101 of the mouse 100 includes two electronic switches 3. Two sides of a front of the bottom wall of the fixing groove 41 has two openings 411 penetrating through the top wall 401, and the two openings 411 are corresponding to the two electronic switches 3. A rear end wall of the at least one opening 411 protrudes downward and extends towards a front end wall of the at least one opening 411 to form a buckling block 412 projecting into the at least one opening 411 and spaced from the front end wall of the at least one opening 411. The first end wall 406 of the at least one opening 411 is the rear end wall of the at least one opening 411, and the second end wall 407 of the at least one opening 411 is the front end wall of the at least one opening 411.

The button shell 5 is mounted on the case 111. The button shell 5 has a fixing portion 51, at least one button 52, and at least one elastic arm 53 connected between the fixing portion 51 and the at least one button 52. The fixing portion 51, the at least one button 52 and the at least one elastic arm 53 are all fixed in the fixing groove 41 formed at the upper surface of the case 111. A bottom surface of the at least one button 52 protrudes downward to form at least one hollow contact portion 521. The at least one contact portion 521 passes through the at least one opening 411 and contacts the pressing portion 31 of the at least one electronic switch 3. A rear surface of the at least one contact portion 521 is recessed inward to form a buckling space 522, and the buckling space 522 is corresponding to the buckling block 412. The buckling block 412 is buckled in the buckling space 522. The rear cover 6 is mounted on a rear portion of the upper cover 4 and covers the fixing portion 51 and the at least one elastic arm 53 of the button shell 5. Preferably, the button shell 5 has two buttons 52 and two elastic arms 53. Bottom surfaces of the two buttons 52 protrude downward to form two contact portions 521.

With reference to FIG. 1 to FIG. 4, in the first preferred embodiment, a bottom of the buckling block 412 is recessed inward and opposite to the pressing portion 31 of the at least one electronic switch 3 to form a first accommodating groove 413. The first accommodating groove 413 is corresponding to and located above the pressing portion 31 of the at least one electronic switch 3. The first accommodating groove 413 is equipped with the first magnet 7. The at least one contact portion 521 is equipped with a second magnet 8.

Figure 4:
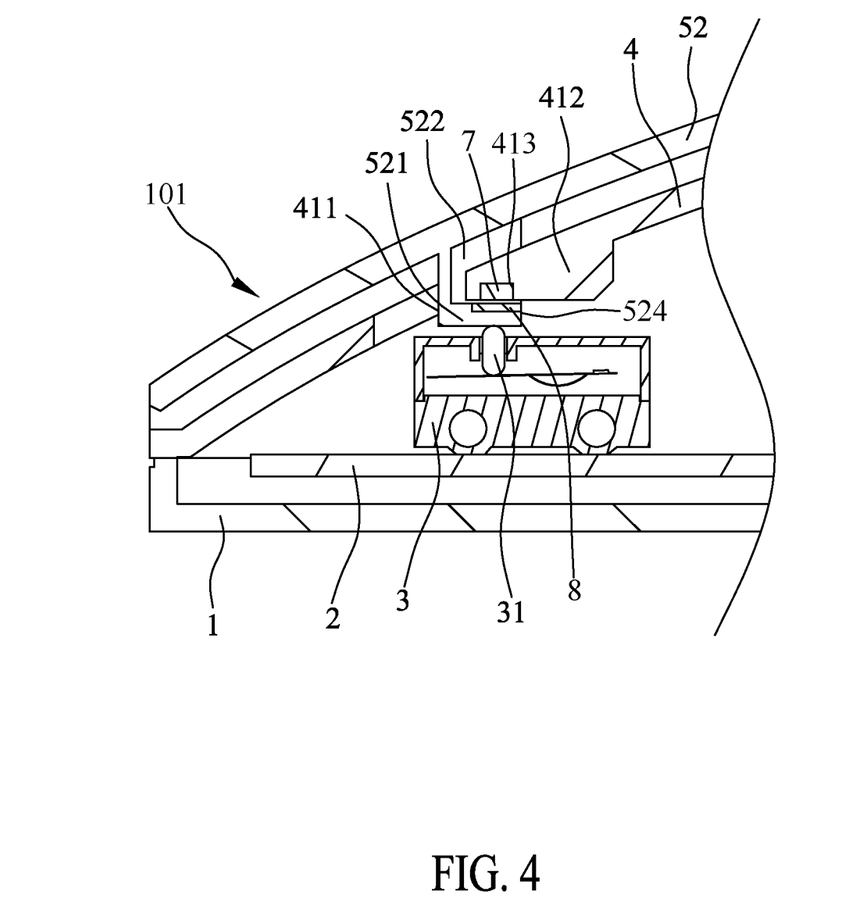
FIG. 4 is a sectional view of the pressing structure of the mouse in accordance with the first preferred embodiment of the present invention and along a line IV-IV of FIG. 1, wherein the pressing structures of the mouses in accordance with the second preferred embodiment and the third preferred embodiment are moved away.

An inside of the buckling space 522 of the at least one contact portion 521 is equipped with the second magnet 8. A top of a bottom wall of the buckling space 522 is recessed downward to form a fastening groove 524. The fastening groove 524 is located above and corresponding to the pressing portion 31 of the at least one electronic switch 3. The fastening groove 524 is equipped with the second magnet 8, and the second magnet 8 is mounted in the buckling space 522. The second magnet 8 is corresponding to and located below the first magnet 7. Polarities of two facing surfaces of the first magnet 7 and the second magnet 8 are the same, so a repulsive force is generated between the first magnet 7 and the second magnet 8. That repulsive force provides a downward force for the second magnet 8 to make the second magnet 8 push the bottom wall of the buckling space 522 of the at least one contact portion 521 of the at least one button 52 to move downward, so that the at least one contact portion 521 is driven by the bottom wall of the buckling space 522 to move downward to keep the at least one contact portion 521 contacting with the pressing portion 31 of the at least one electronic switch 3, at the moment, the at least one elastic arm 53 is deformed to make the bottom wall of the buckling space 522 of the at least one button 52 to move downward and horizontally to keep the at least one contact portion 521 contacting with the pressing portion 31 of the at least one electronic switch 3, nevertheless, the at least one contact portion 521 is without triggering the pressing portion 31 of the at least one electronic switch 3. Consequently, an idle stroke problem of the mouse 100 is prevented from being caused.

After a user uses the mouse 100 for a long time, the at least one contact portion 521 of the pressing structure 101 of the mouse 100 is worn to form an abrasion, the second magnet 8 continuously pushes the bottom wall of the buckling space 522 of the at least one contact portion 521 to move downward by virtue of the repulsive force between the first magnet 7 and the second magnet 8, so that the at least one contact portion 521 keeps contacting with the pressing portion 31 of the at least one electronic switch 3. Furthermore, the pressing structure 101 of the mouse 100 maintains a better hand feeling of the user pressing on the at least one button 52 of the pressing structure 101 of the mouse 100. Consequently, the idle stroke problem of the mouse 100 is prevented from being caused.

With reference to FIG. 1, FIG. 2, FIG. 3 and FIG. 5, in the second preferred embodiment, the bottom of the buckling block 412 is recessed inward and opposite to the pressing portion 31 of the at least one electronic switch 3 to form the first accommodating groove 413. The first accommodating groove 413 is corresponding to and located above the pressing portion 31 of the at least one electronic switch 3. The first accommodating groove 413 is equipped with the first magnet 7. A bottom surface of the at least one contact portion 521 is equipped with the second magnet 8. A bottom surface of the bottom wall of the buckling space 522 is recessed upward to form a second accommodating groove 523. The second accommodating groove 523 is disposed below the first accommodating groove 413. The second accommodating groove 523 is equipped with the second magnet 8. The second magnet 8 is corresponding to and disposed below the first magnet 7. Polarities of two adjacent corresponding surfaces of the first magnet 7 and the second magnet 8 are the same, so the repulsive force is generated between the first magnet 7 and the second magnet 8. The repulsive force provides the downward force for the second magnet 8 to make the second magnet 8 drive the bottom wall of the buckling space 522 of the at least one contact portion 521 to move downward, so that the at least one contact portion 521 is driven by the bottom wall of the buckling space 522 to move downward to keep the at least one contact portion 521 contacting with the pressing portion 31 of the at least one electronic switch 3, at the moment, the at least one elastic arm 53 is deformed to make the bottom wall of the buckling space 522 of the at least one button 52 to move downward and horizontally to keep the at least one contact portion 521 together with the second magnet 8 contacting the pressing portion 31 of the at least one electronic switch 3, nevertheless, the at least one contact portion 521 is without triggering the pressing portion 31 of the at least one electronic switch 3.

Figure 5:
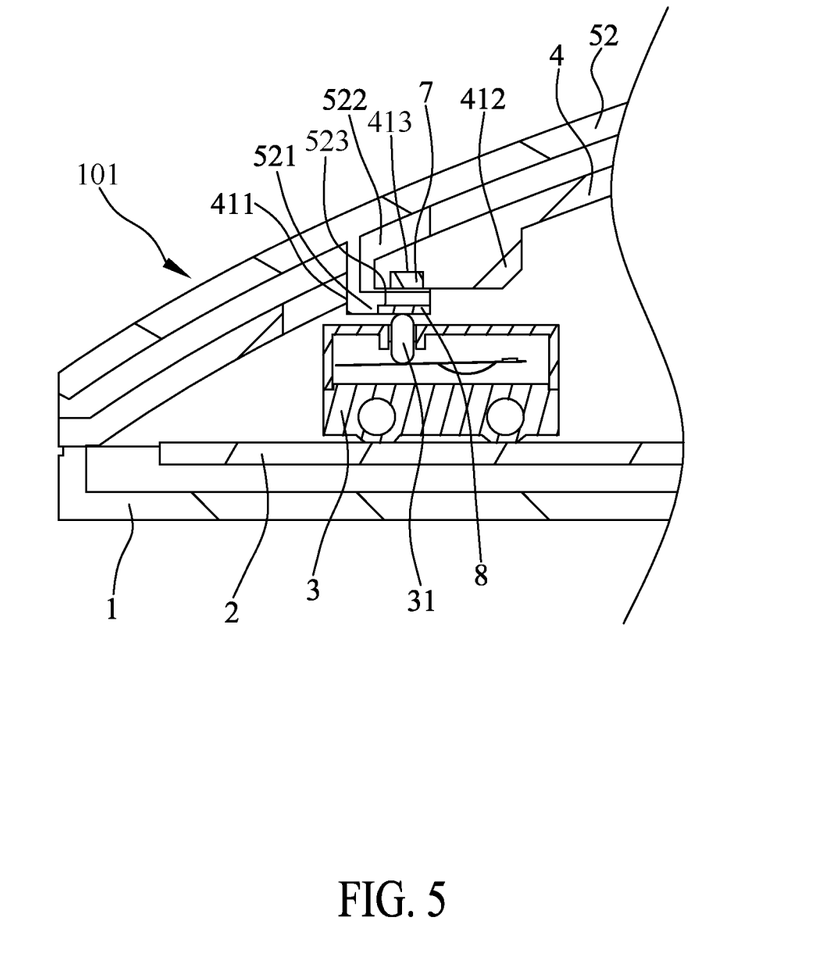
FIG. 5 is a sectional view of the pressing structure of the mouse in accordance with the second preferred embodiment of the present invention and along a line V-V of FIG. 1, wherein the pressing structures of the mouses in accordance with the first preferred embodiment and the third preferred embodiment are moved away.

Because the second magnet 8 is made of a metal, after the user uses the at least one contact portion 521 of the mouse 100 for a long period of time, the at least one contact portion 521 of the pressing structure 101 of the mouse 100 is without being abraded, and when the second magnet 8 drives the bottom wall of the buckling space 522 of the at least one contact portion 521 to move downward, the at least one contact portion 521 keeps contacting with the pressing portion 31 of the at least one electronic switch 3. Furthermore, the pressing structure 101 of the mouse 100 maintains the better hand feeling of the user pressing on the at least one button 52 of the pressing structure 101 of the mouse 100. Consequently, the idle stroke problem of the mouse 100 is prevented from being caused.

With reference to FIG. 1, FIG. 2, FIG. 3 and FIG. 6, in the third preferred embodiment, the bottom surface of the at least one contact portion 521 is recessed upward to form a locating groove 525. The locating groove 525 is located above and corresponding to the pressing portion 31 of the at least one electronic switch 3. The locating groove 525 is equipped with the second magnet 8. The second magnet 8 is disposed above and corresponding to the pressing portion 31 of the at least one electronic switch 3. A material of the pressing portion 31 of the at least one electronic switch 3 is the metal. A material of the second magnet 8 is the metal. The second magnet 8 of the locating groove 525 and the pressing portion 31 of the at least one electronic switch 3 attract each other, so that the second magnet 8 of the locating groove 525 contacts with the pressing portion 31 of the at least one electronic switch 3, nevertheless, the second magnet 8 of the locating groove 525 is without triggering the pressing portion 31 of the at least one electronic switch 3.

Figure 6:
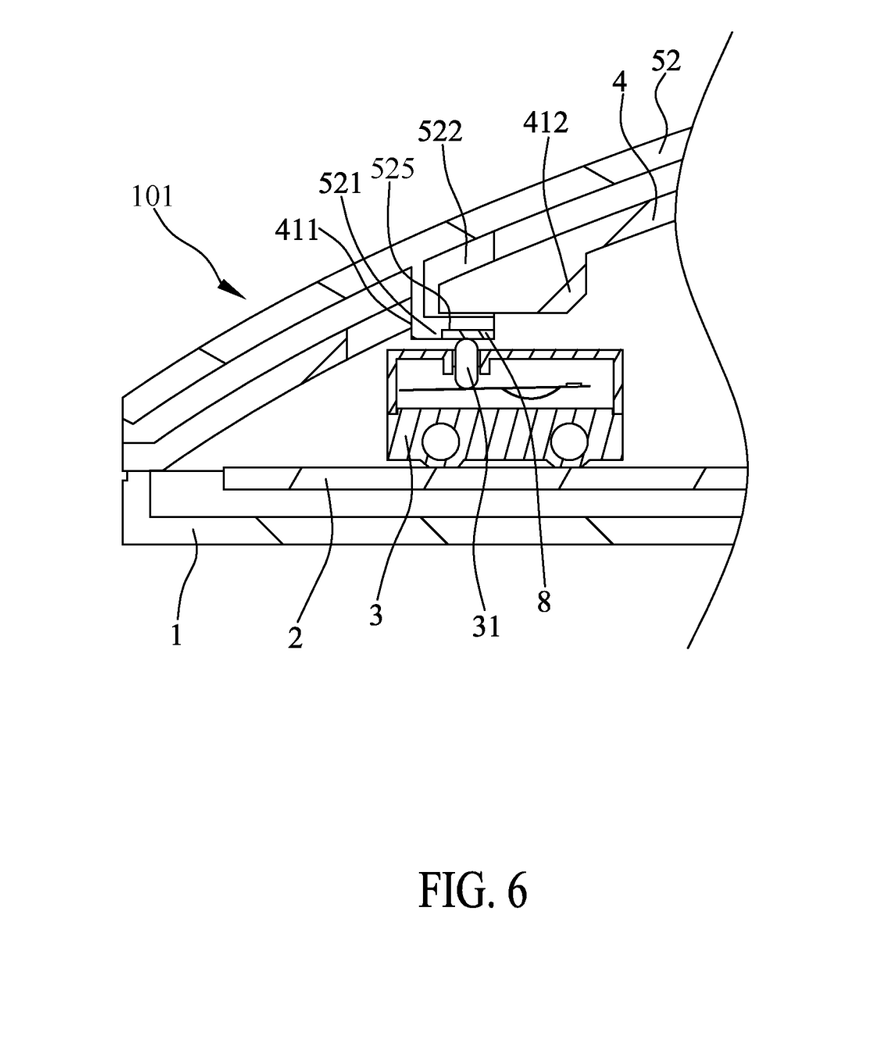
FIG. 6 is a sectional view of the pressing structure of the mouse in accordance with the third preferred embodiment of the present invention and along a line VI-VI of FIG. 1, wherein the pressing structures of the mouses in accordance with the first preferred embodiment and the second preferred embodiment are moved away.

Because the second magnet 8 and the pressing portion 31 of the at least one electronic switch 3 are both made of metals, a magnetic attraction force is generated between the second magnet 8 and the pressing portion 31 of the at least one electronic switch 3 to keep the at least one contact portion 521 together with the second magnet 8 contacting the pressing portion 31 of the at least one electronic switch 3, at the moment, the at least one elastic arm 53 is deformed. Nevertheless, the at least one contact portion 521 is without triggering the pressing portion 31 of the at least one electronic switch 3. After the user uses the at least one contact portion 521 of the mouse 100 for the long period of time, the at least one contact portion 521 of the pressing structure 101 of the mouse 100 is without being abraded, and when the second magnet 8 drives the at least one contact portion 521 to move downward, the at least one contact portion 521 keeps contacting with the pressing portion 31 of the at least one electronic switch 3. Furthermore, the pressing structure 101 of the mouse 100 maintains the better hand feeling of the user pressing on the at least one button 52 of the pressing structure 101 of the mouse 100. Consequently, the idle stroke problem of the mouse 100 is prevented from being caused.

As described above, after the user uses the at least one contact portion 521 of the mouse 100 for the long period of time, the at least one contact portion 521 of the pressing structure 101 of the mouse 100 is without being abraded, and the at least one contact portion 521 keeps contacting with the pressing portion 31 of the at least one electronic switch 3, so the pressing structure 101 of the mouse 100 maintains the better hand feeling of the user pressing on the at least one button 52 of the pressing structure 101 of the mouse 100. As a result, the idle stroke problem of the mouse 100 is prevented from being caused.

Descriptions disclosed above are just the preferred embodiments of the present invention, certainly, an application patent extent of the present invention is without being limited to the descriptions disclosed above, equivalent changes according to the application patent extent of the present invention still belong to the application patent extent of the present invention.

What is claimed is:

1. A pressing structure of a mouse, comprising:
a base;
a circuit board mounted on the base;
at least one electronic switch mounted on the circuit board, the at least one electronic switch having a pressing portion, and the pressing portion being exposed upward from a top of the at least one electronic switch;
an upper cover mounted on the base, and covering the circuit board and the at least one electronic switch, an upper surface of the upper cover being recessed downward to form a fixing groove, at least one portion of a bottom wall of the fixing groove having at least one opening penetrating through the bottom wall of the fixing groove and communicated with the fixing groove, and the at least one opening being corresponding to the at least one electronic switch, a rear end wall of the at least one opening protruding downward and extending towards a front end wall of the at least one opening to form a buckling block projecting into the at least one opening and spaced from the front end wall of the at least one opening, a bottom of the buckling block being recessed inward and opposite to the pressing portion of the at least one electronic switch to form a first accommodating groove, the first accommodating groove being corresponding to and located above the pressing portion of the at least one electronic switch, the first accommodating groove being equipped with a first magnet; and
a button shell having a fixing portion, at least one button, and at least one elastic arm connected between the fixing portion and the at least one button, the fixing portion, the at least one button and the at least one elastic arm being fixed in the fixing groove, a bottom surface of the at least one button protruding downward to form at least one contact portion, the at least one contact portion passing through the at least one opening and contacting the pressing portion of the at least one electronic switch, a rear surface of the at least one contact portion being recessed inward to form a buckling space, and the buckling space being corresponding to the buckling block, the buckling block being buckled in the buckling space, an inside of the buckling space of the at least one contact portion being equipped with a second magnet, the second magnet being corresponding to and located below the first magnet, polarities of two facing surfaces of the first magnet and the second magnet being the same, so a repulsive force being generated between the first magnet and the second magnet.

2. The pressing structure of the mouse as claimed in claim 1, wherein a top of a bottom wall of the buckling space is recessed downward to form a fastening groove, the fastening groove is equipped with the second magnet.

3. The pressing structure of the mouse as claimed in claim 2, wherein the fastening groove is located above and corresponding to the pressing portion of the at least one electronic switch.

4. The pressing structure of the mouse as claimed in claim 2, wherein the repulsive force provides a downward force for the second magnet to make the second magnet push the bottom wall of the buckling space of the at least one contact portion of the at least one button to move downward, so that the at least one contact portion is driven by the bottom wall of the buckling space to move downward to keep the at least one contact portion contacting with the pressing portion of the at least one electronic switch, at the moment, the at least one elastic arm is deformed.

5. The pressing structure of the mouse as claimed in claim 1, wherein the upper cover is of a hollow shape, the upper cover has a top wall arched upward, and two lateral walls extended downward from two opposite sides of the top wall, the upper cover has a receiving space penetrating through a bottom of the upper cover, and the receiving space is surrounded among the top wall and the two lateral walls.

6. The pressing structure of the mouse as claimed in claim 1, further comprising a rear cover, the rear cover being mounted on a rear portion of the upper cover and covering the fixing portion and the at least one elastic arm of the button shell.

7. A pressing structure of a mouse, comprising:
a circuit board;
at least one electronic switch mounted on the circuit board, the at least one electronic switch having a pressing portion, and the pressing portion being exposed upward from a top of the at least one electronic switch;
a case receiving the circuit board and the at least one electronic switch, the case having at least one opening penetrating through an upper surface and a lower surface of the case, and the at least one opening being corresponding to the at least one electronic switch, a first end wall of the at least one opening protruding downward and extending towards a second end wall of the at least one opening opposite to the first end wall of the at least one opening to form a buckling block projecting into the at least one opening and spaced from the second end wall of the at least one opening, the buckling block being equipped with a first magnet, and the first magnet being corresponding to and located above the pressing portion of the at least one electronic switch; and
a button shell mounted on the case, the button shell having at least one button, the at least one button protruding downward to form at least one contact portion, the at least one contact portion passing through the at least one opening and contacting the pressing portion of the at least one electronic switch, a surface of the at least one contact portion being recessed inward to form a buckling space, and the buckling space being corresponding to the buckling block, the buckling block being buckled in the buckling space, a bottom surface of the at least one contact portion being equipped with a second magnet, the second magnet being disposed above and corresponding to the pressing portion of the at least one electronic switch, the second magnet being made of metal, the second magnet being corresponding to and disposed below the first magnet, polarities of two adjacent corresponding surfaces of the first magnet and the second magnet being the same, so a repulsive force being generated between the first magnet and the second magnet.

8. The pressing structure of the mouse as claimed in claim 7, wherein a bottom of the buckling block is recessed inward and opposite to the pressing portion of the at least one electronic switch to form a first accommodating groove, the first accommodating groove is corresponding to and located above the pressing portion of the at least one electronic switch, the first accommodating groove is equipped with the first magnet.

9. The pressing structure of the mouse as claimed in claim 8, wherein a bottom surface of a bottom wall of the buckling space is recessed upward to form a second accommodating groove, the second accommodating groove is disposed below the first accommodating groove, the second accommodating groove is equipped with the second magnet.

10. The pressing structure of the mouse as claimed in claim 9, wherein the repulsive force provides a downward force for the second magnet to make the second magnet drive the bottom wall of the buckling space of the at least one contact portion to move downward, so that the at least one contact portion is driven by the bottom wall of the buckling space to move downward to keep the at least one contact portion together with the second magnet contacting the pressing portion of the at least one electronic switch, at the moment, the at least one elastic arm is deformed.

11. The pressing structure of the mouse as claimed in claim 9, wherein the second accommodating groove is located above and corresponding to the pressing portion of the at least one electronic switch.

12. The pressing structure of the mouse as claimed in claim 7, wherein the case includes a base and an upper cover, the upper cover is mounted on the base, and covers the circuit board and the at least one electronic switch, an upper surface of the upper cover is recessed downward to form a fixing groove, at least one portion of a bottom wall of the fixing groove has the at least one opening penetrating through the bottom wall of the fixing groove and communicated with the fixing groove, a rear end wall of the at least one opening protrudes downward and extends towards a front end wall of the at least one opening to form the buckling block projecting into the at least one opening and spaced from the front end wall of the at least one opening.

13. The pressing structure of the mouse as claimed in claim 12, wherein the button shell further has a fixing portion, and at least one elastic arm connected between the fixing portion and the at least one button, the fixing portion, the at least one button and the at least one elastic arm are fixed in the fixing groove, the case includes a rear cover, the rear cover is mounted on a rear portion of the upper cover and covers the fixing portion and the at least one elastic arm of the button shell.

14. The pressing structure of the mouse as claimed in claim 7, wherein the button shell further has a fixing portion, and at least one elastic arm connected between the fixing portion and the at least one button, the fixing portion, the at least one button and the at least one elastic arm are fixed in a fixing groove formed at the upper surface of the case.

15. A pressing structure of a mouse, comprising:
a base;
a circuit board mounted on the base;
at least one electronic switch mounted on the circuit board, the at least one electronic switch having a pressing portion, and the pressing portion being exposed upward from a top of the at least one electronic switch, a material of the pressing portion of the at least one electronic switch being a metal;
an upper cover mounted on the base, and covering the circuit board and the at least one electronic switch, an upper surface of the upper cover being recessed downward to form a fixing groove, at least one portion of a bottom wall of the fixing groove having at least one opening penetrating through the bottom wall of the fixing groove and communicated with the fixing groove, and the at least one opening being corresponding to the at least one electronic switch, a rear end wall of the at least one opening protruding downward and extending towards a front end wall of the at least one opening to form a buckling block projecting into the at least one opening and spaced from the front end wall of the at least one opening; and
a button shell having a fixing portion, at least one button, and at least one elastic arm connected between the fixing portion and the at least one button, the fixing portion, the at least one button and the at least one elastic arm being fixed in the fixing groove, a bottom surface of the at least one button protruding downward to form at least one contact portion, the at least one contact portion passing through the at least one opening and contacting the pressing portion of the at least one electronic switch, a rear surface of the at least one contact portion being recessed inward to form a buckling space, and the buckling space being corresponding to the buckling block, the buckling block being buckled in the buckling space, a bottom surface of the at least one contact portion being equipped with a second magnet, the second magnet being disposed above and corresponding to the pressing portion of the at least one electronic switch, a material of the second magnet being the metal, a magnetic attraction force being generated between the second magnet and the pressing portion of the at least one electronic switch to keep the at least one contact portion together with the second magnet contacting the pressing portion of the at least one electronic switch.

16. The pressing structure of the mouse as claimed in claim 15, wherein the bottom surface of the at least one contact portion is recessed upward to form a locating groove, the locating groove is located above and corresponding to the pressing portion of the at least one electronic switch, the locating groove is equipped with the second magnet.

17. The pressing structure of the mouse as claimed in claim 15, further comprising a rear cover, the rear cover being mounted on a rear portion of the upper cover and covering the fixing portion and the at least one elastic arm of the button shell.

\* \* \* \* \*